US007131209B2

(12) United States Patent
Kim

(10) Patent No.: US 7,131,209 B2
(45) Date of Patent: Nov. 7, 2006

(54) APPARATUS FOR MEASURING HORIZONTAL LEVEL OF A WAFER CHUCK

(75) Inventor: Young-Jong Kim, Ohsan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/844,241

(22) Filed: May 12, 2004

(65) Prior Publication Data

US 2005/0005466 A1   Jan. 13, 2005

(30) Foreign Application Priority Data

Jul. 7, 2003   (KR) ...................... 10-2003-0045789

(51) Int. Cl.
*G01C 9/10* (2006.01)
(52) U.S. Cl. ............................ 33/533; 33/549; 33/613; 33/365
(58) Field of Classification Search ................ 33/613, 33/645, 1 N, 549–555, 675, 503, 557, 560, 33/638, 365; 414/936
See application file for complete search history.

(56) References Cited

U.S. PATENT DOCUMENTS

| | | | | | |
|---|---|---|---|---|---|
| 3,110,112 | A | * | 11/1963 | Dalgleish ...................... | 33/552 |
| 3,899,832 | A | * | 8/1975 | Hunyar ......................... | 33/552 |
| 4,255,862 | A | * | 3/1981 | Nakamura .................... | 33/503 |
| 4,821,425 | A | * | 4/1989 | Currie et al. .................. | 33/520 |
| 4,916,824 | A | * | 4/1990 | Shimazutsu et al. .......... | 33/551 |
| 4,934,064 | A | * | 6/1990 | Yamaguchi et al. .......... | 33/645 |
| 5,048,195 | A | * | 9/1991 | Leonov ........................ | 33/645 |
| 5,101,835 | A | * | 4/1992 | DelRe ......................... | 33/555 |
| 5,231,767 | A | * | 8/1993 | Brinley ........................ | 33/533 |
| 5,535,143 | A | * | 7/1996 | Face ............................ | 33/552 |
| 5,822,877 | A | * | 10/1998 | Dai .............................. | 33/560 |
| 5,826,345 | A | * | 10/1998 | Hendricks .................... | 33/365 |
| 5,974,679 | A | * | 11/1999 | Birang et al. ................. | 33/553 |
| 5,996,946 | A | * | 12/1999 | Bailey ......................... | 33/555 |
| 6,442,857 | B1 | * | 9/2002 | Atsuhiko et al. ............. | 33/553 |
| 6,499,367 | B1 | * | 12/2002 | Saeki .......................... | 33/549 |
| 6,536,128 | B1 | * | 3/2003 | Glanzmann .................. | 33/553 |
| 6,634,114 | B1 | * | 10/2003 | Bidwell ....................... | 33/542 |
| 6,701,633 | B1 | * | 3/2004 | Ohtsuka ...................... | 33/552 |
| 6,826,840 | B1 | * | 12/2004 | Lindsey et al. .............. | 33/18.1 |

FOREIGN PATENT DOCUMENTS

KR   990076333   10/1999
KR   2000-0011628   7/2000

* cited by examiner

*Primary Examiner*—Yaritza Guadalupe-McCall
(74) *Attorney, Agent, or Firm*—F. Chau & Associates LLC

(57) ABSTRACT

An apparatus for measuring a horizontal level of a wafer chuck, including a measuring part for contacting the wafer chuck to measure a horizontal level, a mounting part on which the measuring part is mounted, and a supporting part for supporting the mounting part. The measuring part may include a center gage and a plurality of edge gages.

20 Claims, 6 Drawing Sheets

APPARATUS FOR MEASURING HORIZONTAL LEVEL OF A WAFER CHUCK

TECHNICAL FIELD

The present disclosure relates to an apparatus for measuring a horizontal level of a wafer chuck.

BACKGROUND OF THE INVENTION

In processes for manufacturing various semiconductor devices, it is important to regularly maintain the horizontal levels of the devices. Particularly, it is very significant to regulate their horizontal levels. For example, an electrical die sorting (EDS) process or a chip sorting process is necessarily performed to determine whether individual chips or dies constituting a wafer have good or bad electrical properties.

In the case of a probe apparatus, the horizontal level of a chuck on which a wafer is placed is very significant. If the horizontal level of the chuck is not properly aligned, a needle of a probe card punches the wafer. Namely, the improper horizontal level of the chuck contributes to a contact error. Thus in the probe apparatus, the horizontal level of the chip is periodically checked and regulated.

In a conventional horizontal level measuring method, after fixing an analog gage to a measuring standard point, five horizontal points are measured by moving a wafer chuck. Since a user must move the wafer chuck, a reliability of measured values is degraded.

Further, the user checks a faulty horizontal level of the wafer chuck and regulates the horizontal level by rotating respective leveling bolts based on the measured value. Therefore, a procedure for checking the horizontal level of the wafer chuck must be iteratively performed.

SUMMARY OF THE INVENTION

A feature of an embodiment of the present invention is to provide an apparatus for measuring a horizontal level of a wafer chuck, for checking a horizontal level of a wafer chuck without moving the wafer chuck.

According to an embodiment of the present invention, an apparatus for measuring a horizontal level of a wafer chuck, for example, in a semiconductor test system, comprises a measuring part for contacting the wafer chuck to measure the horizontal level, a mounting part on which the measuring part is mounted, and a supporting part for supporting the mounting part.

The measuring part may include a center gage for measuring a horizontal level of the center of the wafer chuck and at least two edge gages for measuring horizontal levels of edges of the wafer chuck. The mounting part may include a plurality of supporting rods and a circular supporting ring for connecting the supporting rods. An edge gage may be installed at the edge of each respective supporting rod. The mounting part may include a circular plate on which the gages are mounted.

The supporting part may comprise a base, a first supporting shaft, and a second supporting shaft having a moving bar installed at the first supporting shaft to be movable up and down relative to a surface of the wafer chuck contacted by the measuring part. The mounting part may be installed at the end of the second supporting shaft. The supporting part may further comprise a bearing that is installed at the base and connected with a groove formed at a lower edge of the first supporting shaft for rotating the first supporting shaft.

The supporting part also may comprise a moving means for moving the second supporting shaft, the moving means including a rack coupled to the moving bar, a pinion connected in conjunction with the rack, and a level control bolt connected with the pinion.

According to another embodiment of the present invention, an apparatus for measuring a horizontal level of a wafer chuck comprises a plurality of gages for contacting the wafer chuck to measure a horizontal level, a mounting part on which the gages are coplanarly mounted, and a supporting part for supporting the mounting part and moving the mounting part such that probe needles of the gages contact a surface of the wafer chuck.

According to another embodiment of the present invention, an apparatus for measuring a horizontal level of a wafer chuck, comprises at least one gage for contacting the wafer chuck, a mounting part on which the at least one gage is mounted, and a supporting part for supporting the mounting part and moving the mounting part such that the at least one gage contacts a surface of the wafer chuck.

The supporting part may comprise a supporting shaft including a moving bar, wherein the moving bar is movable to and from the surface of the wafer chuck contacted by the at least one gage, and wherein the mounting part is positioned at an end of the supporting shaft.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Preferred embodiments of the present invention will now be described more fully hereinafter below in more detail with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
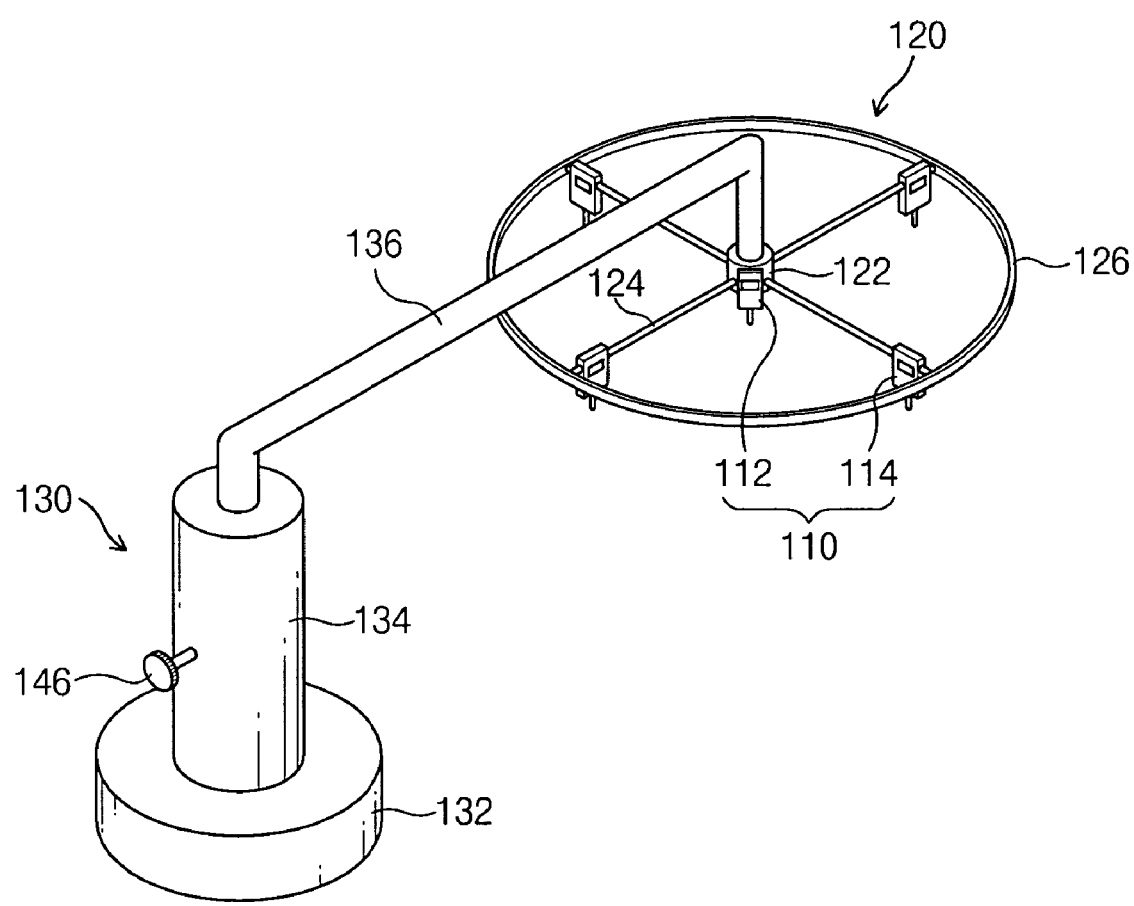
FIG. 1 is perspective view of a horizontal level measuring apparatus according to an embodiment of the present invention.
Figure 2:
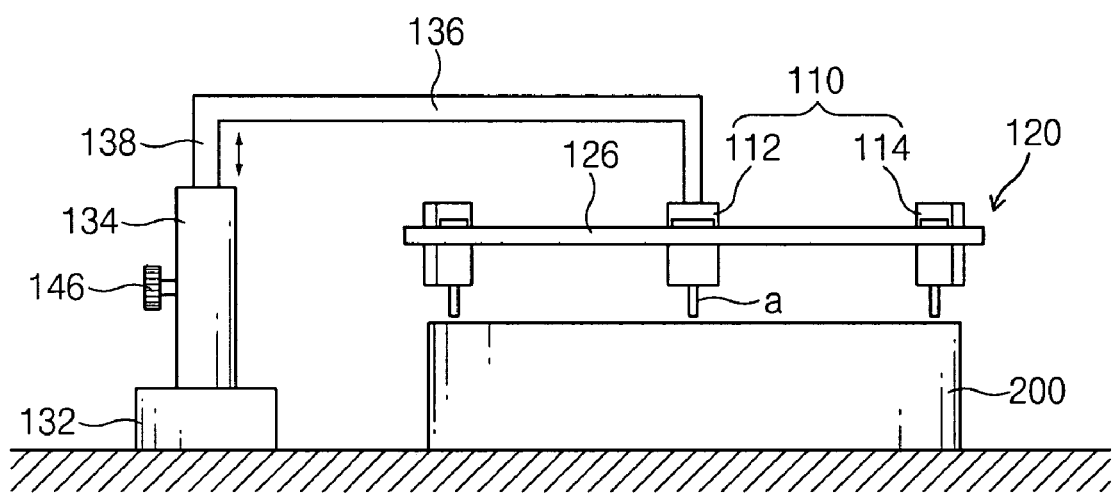
FIG. 2 is a side view of the horizontal level measuring apparatus according to an embodiment of the present invention.
Figure 3:
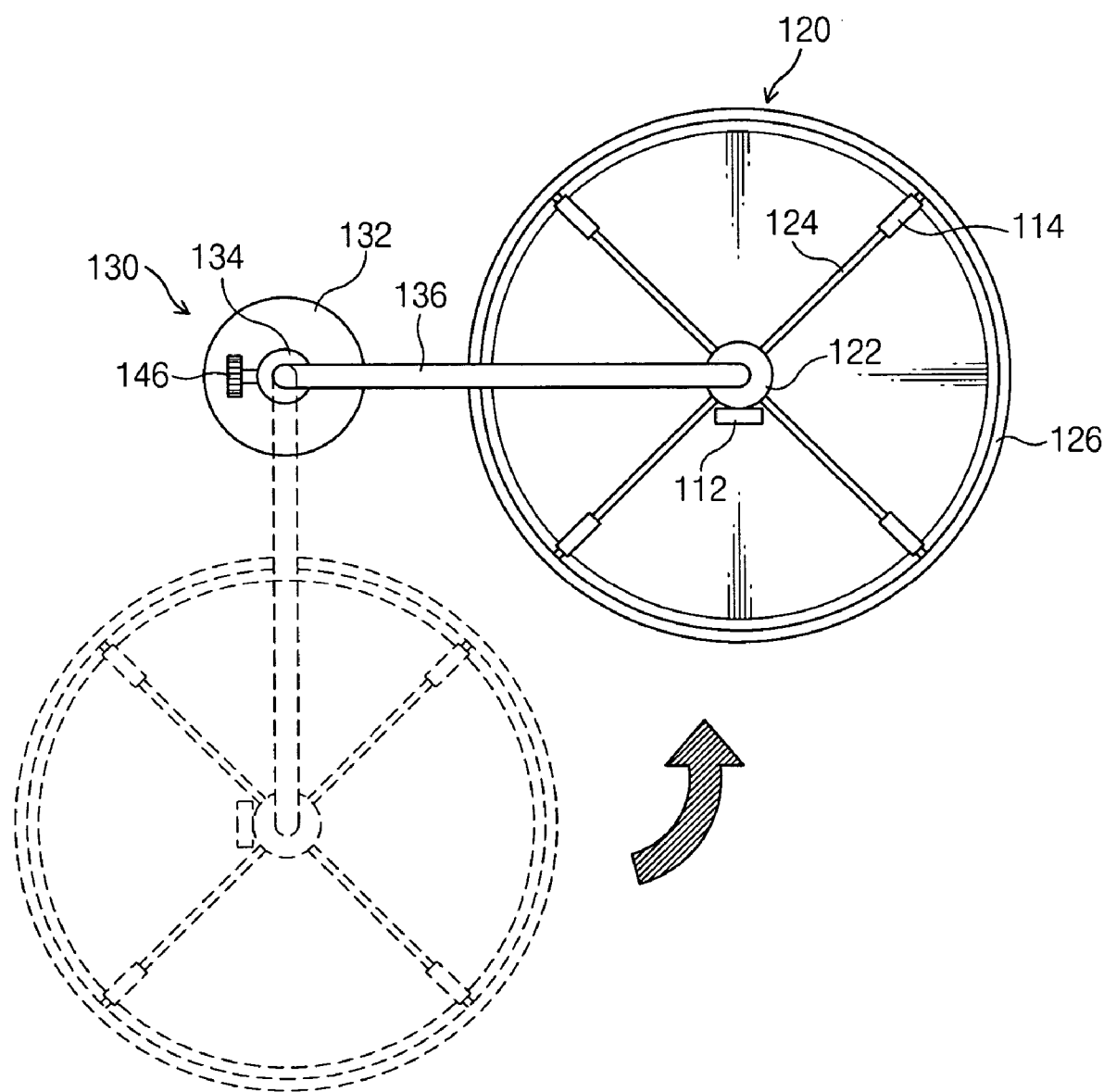
FIG. 3 is a top plan view of the horizontal level measuring apparatus according to an embodiment of the present invention.

FIG. 1 through FIG. 3 illustrate an apparatus for measuring a horizontal level of a wafer chuck (hereinafter referred to as "horizontal level measuring apparatus") according to an embodiment of the present invention.

As shown in FIG. 1, a horizontal level measuring apparatus 100 includes a measuring part 110, a mounting part 120, and a supporting part 130.

The measuring part 110 has five digital gages 112, 114 that contact a wafer chuck 200 (FIG. 2) to measure a horizontal level of the wafer chuck 200. The five digital gages include a center gage 112 for measuring a horizontal level of the center of the wafer chuck 200 and four edge gages 114 for measuring a horizontal level of the edge of the wafer chuck 200. The number of edge gages 114 may be vary. For example, two edge gages 114 may be used instead of four.

Figure 6:
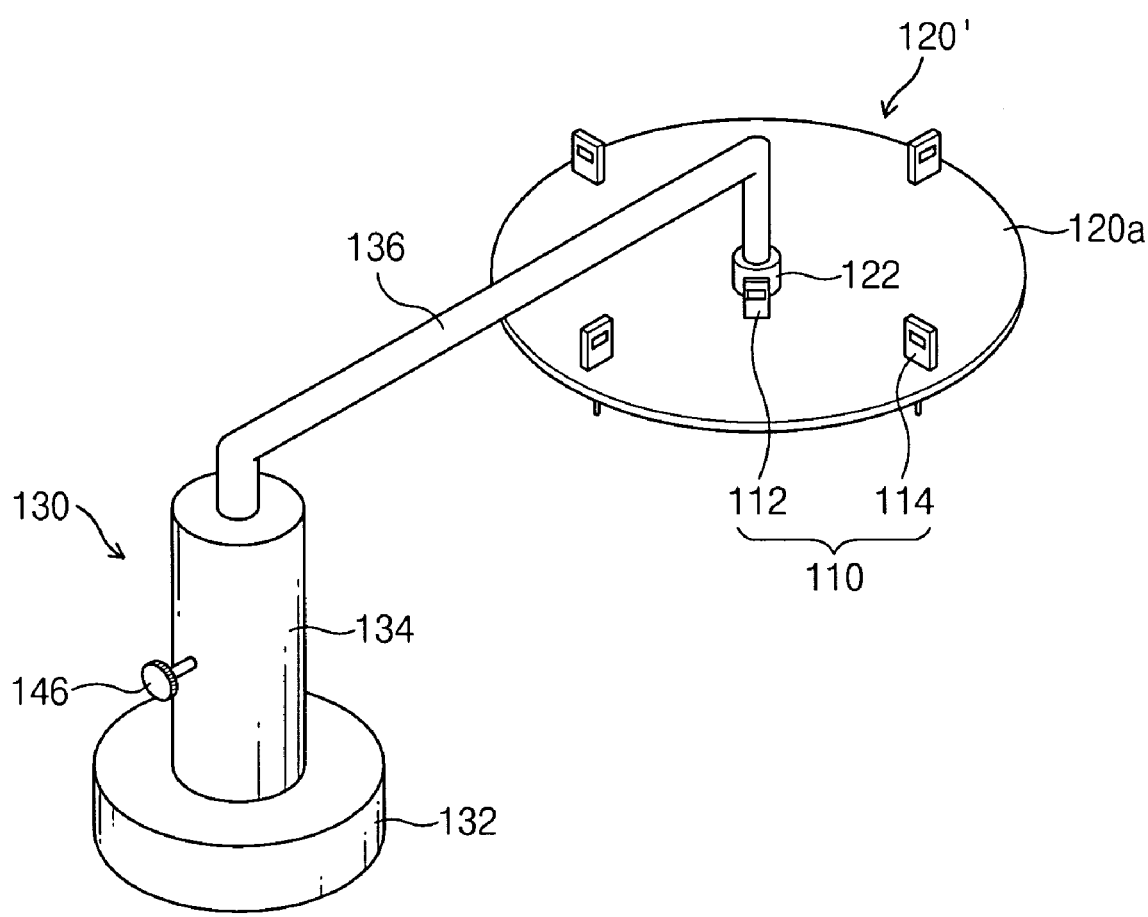
FIG. 6 is a diagram showing a mounting part having a circular plate according to an embodiment of the present invention.

The center gage 112 is mounted on a central portion 122 of the mounting part 120. The edge gages 114 are installed on respective supporting rods 124 extending from the central portion 122. The mounting part 120 includes a circular ring 126 that connects ends of the supporting rods 124. Alternatively, FIG. 6 shows a horizontal level measuring apparatus 100 employing a mounting part 120' having a circular plate 120a. As a result, the mounting part may have various shapes and configurations for mounting gages thereon.

The mounting part 120 is installed at the end of a second supporting shaft 136 of the supporting part 130. The second supporting shaft 136 is rotated and moved up and down such that the gages 112, 114 contact and are released from contacting the wafer chuck 200.

Figure 5:
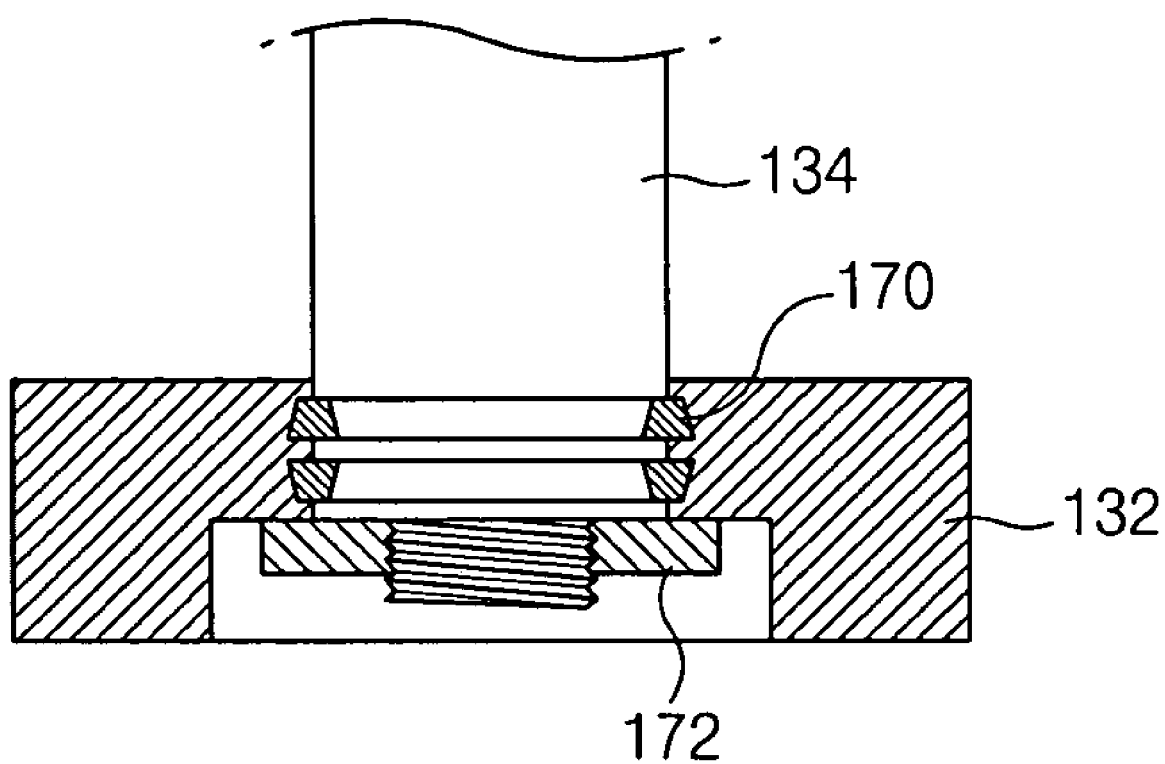
FIG. 5 is a diagram showing a connecting portion of a base and a supporting shaft according to an embodiment of the present invention.

The mounting part 120 includes a base 132 and a first supporting shaft 134 running vertically from the base 132. The first supporting shaft 134 is rotatably installed to the base 132, as shown in FIG. 5. To rotate the first supporting shaft 134, a bearing 170 is positioned at the base 132 and connected with a groove formed at a lower edge of the first supporting part 134. A nut 172 is coupled to the end of the first supporting shaft 134. FIG. 3 shows that the mounting part 120 rotates with the first supporting shaft 134 to be disposed on the wafer chuck 200.

Figure 4:
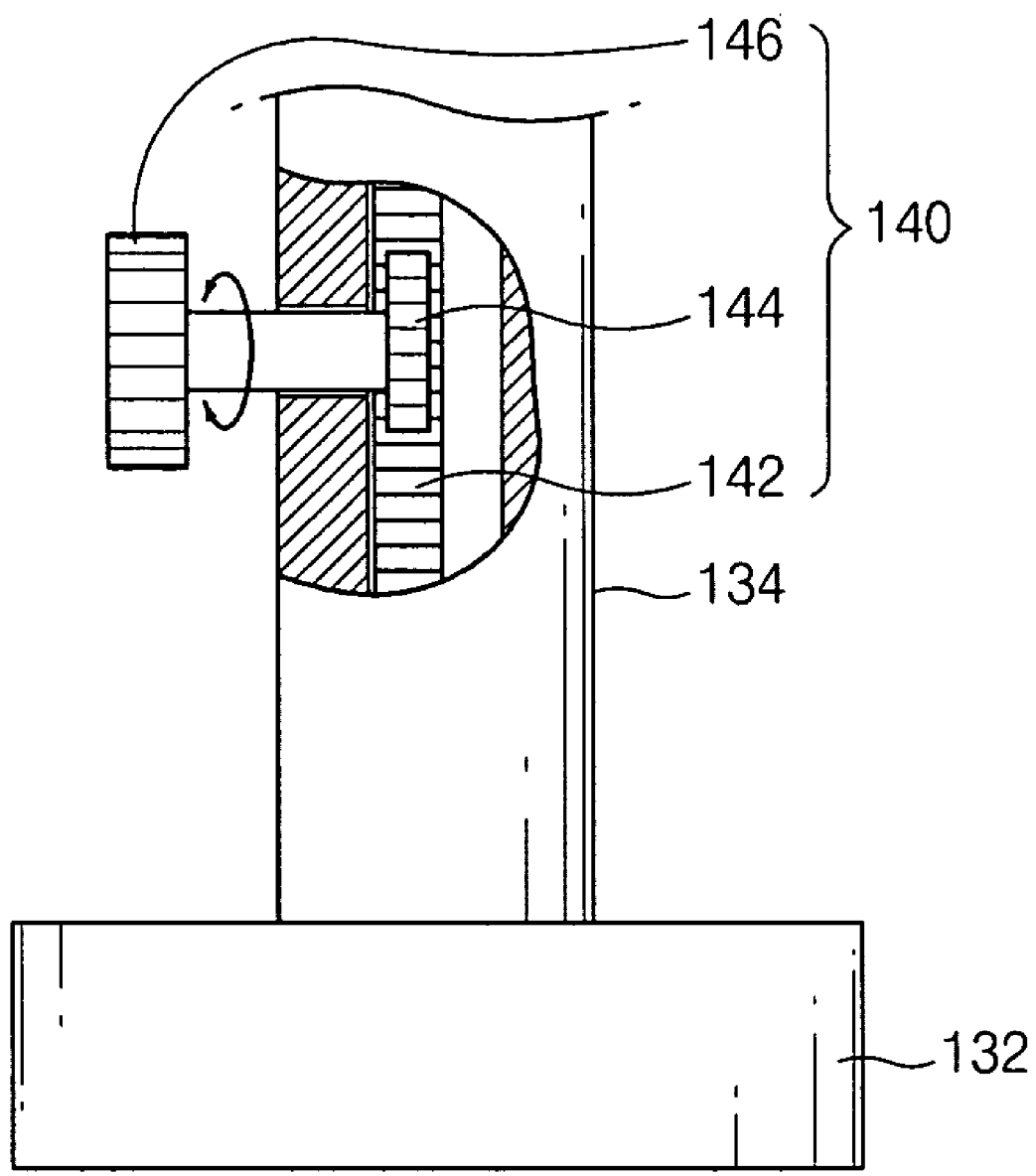
FIG. 4 is a diagram illustrating a moving means for moving a supporting shaft up and down according to an embodiment of the present invention.

Referring to FIG. 4, the second supporting shaft 136 includes a moving bar 138 that is positioned in the first supporting shaft 134 to be movable up and down relative to the surface of the wafer chuck 200 contacted by the gages 112 and 114, as shown by the two-headed arrow in FIG. 2. To move the moving bar 138 up and down, the supporting part 130 includes moving means 140, including a rack 142 connected to the moving part 138 of the second supporting shaft 136, a pinion 144 connected to the rack 142, and a level control bolt 146 connected to the pinion 144. When the bolt 146 is turned, the pinion 144 rotates and the rack 142 moves in the vertical direction. As a result, the second supporting shaft 136 moves up and down. Although a moving method using a rack and a pinion is used in this embodiment, a cylinder driving method using hydraulic pressure or other driving methods may be used for moving the second supporting shaft 136.

Now, described are steps for measuring a horizontal level of a wafer chuck installed in a semiconductor test system using the horizontal level measuring apparatus 100 according to an embodiment of the present invention.

Referring to FIG. 2, the horizontal level measuring apparatus 100 is mounted on a top surface of a stage where the wafer chuck 200 is disposed. As shown in FIG. 3, the first supporting shaft 134 rotates such that the mounting part 120 is disposed on the wafer chuck 200. When the mounting part 120 is disposed on the wafer chuck 200, the level control bolt 146 of the moving means 140 is turned to move the second supporting shaft 136 down. The mounting part 120 moves down together with the second supporting shaft 136, and the gages 112 and 114 measure a horizontal level while a probe needle "a" of each gage is in contact with the wafer chuck 200.

According to an embodiment of the present invention, a horizontal level of a wafer chuck 200 is checked by eye, that is, by reading the gages 112 and 114, and the wafer chuck 200 does not move. Therefore, a reliability of a horizontal level measuring work is enhanced.

The horizontal level measuring apparatus 100 may be designed according to a structure of an object (e.g., a wafer chuck) to require a horizontal level measurement and horizontal measuring points. Particularly, the structure of the mounting part may be designed according to the number of gages mounted thereon, a gate mounting method, a size of the object, and a measuring method.

Horizontal states of five points on a wafer chuck are checked by reading the gages 112 and 114 to easily control a horizontal level of the wafer chuck 200.

The horizontal level measuring apparatus 100 according to embodiments of the invention can be used on a stage on which a wafer is loaded during a semiconductor manufacturing process. Preferably, the horizontal level measuring apparatus is applied to measure a horizontal level of a wafer chuck in a probe apparatus used in an EDS process.

Although the illustrative embodiments have been described herein with reference to the accompanying drawings, it is to be understood that the present invention is not limited to those precise embodiments, and that various modifications and changes may be made by one of ordinary skill in the related art without departing from the scope or spirit of the invention. All such changes and modifications are intended to be included within the scope of the invention as defined by the appended claims.

What is claimed is:

1. An apparatus for measuring a horizontal level of a wafer chuck, comprising:
    a measuring part for contacting the wafer chuck;
    a mounting part on which the measuring part is mounted; and
    a supporting part for supporting the mounting part, the supporting part comprising:
        a first supporting shaft which is rotatable such that the mounting part is disposed on the wafer chuck; and
        a second supporting shaft including a moving bar located at a first end of the second supporting shaft, wherein:
            the moving bar is positioned in the first supporting shaft,
            the moving bar is movable up and down relative to a surface of the wafer chuck contacted by the measuring part, and
            the mounting part is positioned at a second end of the second supporting shaft.

2. The apparatus as recited in claim 1, wherein the measuring part includes a center gage for measuring a horizontal level of a center of the wafer chuck.

3. The apparatus as recited in claim 1, wherein the measuring part includes at least two edge gages for measuring a horizontal level of at least one edge of the wafer chuck.

4. The apparatus as recited in claim 1, wherein the measuring part includes a center gage for measuring a horizontal level of a center of the wafer chuck and at least two edge gages for measuring a horizontal level of at least one edge of the wafer chuck.

5. The apparatus as recited in claim 4, wherein the mounting part includes a plurality of supporting rods and the at least two edge gages are positioned on respective supporting rods of the plurality of supporting rods.

6. The apparatus as recited in claim 5, wherein the mounting part further includes a supporting ring for connecting the plurality of supporting rods.

7. The apparatus as recited in claim 4, wherein the mounting part includes a circular plate on which the center gage and the at least two edge gages are mounted.

8. The apparatus as recited in claim 1, wherein the supporting part further comprises:
a base, wherein the first supporting shaft extends vertically from the base.

9. The apparatus as recited in claim 8, wherein the supporting part further comprises a bearing positioned at the base and connected with a groove formed at an edge of the first supporting shaft for rotating the first supporting shaft.

10. The apparatus as recited in claim 1, wherein the supporting part further comprises moving means for moving the second supporting shaft.

11. The apparatus as recited in claim 10, wherein the moving means comprises:
a rack connected to the moving bar; a pinion connected to the rack; and
a level control bolt connected to the pinion.

12. An apparatus for measuring a horizontal level of a wafer chuck, comprising:
a plurality of gages for contacting the wafer chuck;
a mounting part on which the plurality of gages are coplanarly mounted; and
a supporting part for supporting the mounting part and moving the mounting part such that probe needles of the plurality of gages contact a surface of the wafer chuck, the supporting part comprising:
a first supporting shaft; and
a second supporting shaft including a moving bar positioned in the first supporting shaft, wherein the moving bar is movable up and down relative to the surface of the wafer chuck contacted by the probe needles, and wherein the mounting part is positioned at an end of the second supporting shaft.

13. The apparatus as recited in claim 12, wherein the plurality of gages include a center gage for measuring a horizontal level of a center of the wafer chuck and at least two edge gages for measuring a horizontal level of at least one edge of the wafer chuck.

14. The apparatus as recited in claim 12, wherein the mounting part comprises:
a plurality of supporting rods, wherein each supporting rod of the plurality of supporting rods is coupled to an end of a respective gage of the plurality of gages; and
a supporting ring for connecting the supporting rods.

15. The apparatus as recited in claim 12, wherein the supporting part further comprises:
a base, wherein the first supporting shaft extends from a top portion of the base.

16. The apparatus as recited in claim 15, wherein the supporting part further comprises:

a bearing positioned at the base and connected with a groove formed at an edge of the first supporting shaft for rotating the first supporting shaft; and
moving means for moving the second supporting shaft.

17. The apparatus as recited in claim 16, wherein the moving means comprises:
a rack connected to the moving bar;
a pinion connected to the rack; and
a level control bolt connected to the pinion.

18. An apparatus for measuring a horizontal level of a wafer chuck, comprising:
a plurality of gages for contacting the wafer chuck;
a mounting part on which the plurality of gages are mounted; and
a supporting part for supporting the mounting part and moving the mounting part such that the plurality of gages contact a surface of the wafer chuck, wherein the supporting part comprises:
a supporting shaft including a moving bar, wherein the moving bar is movable to and from the surface of the wafer chuck contacted by the plurality of gages, and wherein the mounting part is positioned at an end of the supporting shaft;
a rack connected to the moving bar;
a pinion connected to the rack; and
a level control bolt connected to the pinion.

19. The apparatus as recited in claim 18, wherein the mounting part comprises:
a plurality of supporting rods, wherein each supporting rod of the plurality of supporting rods is coupled to an end of a respective gage of the plurality of gages.

20. An apparatus for measuring a horizontal level of a wafer chuck, comprising:
a measuring part for contacting the wafer chuck;
a mounting part on which the measuring part is mounted; and
a supporting part for supporting the mounting part, the supporting part comprising:
a first supporting shaft; and
a second supporting shaft including a moving bar located at a first end of the second supporting shaft, wherein:
at least a portion of the second supporting shaft extends substantially perpendicular to the first supporting shaft,
the moving bar is positioned in the first supporting shaft,
the moving bar is movable up and down relative to a surface of the wafer chuck contacted by the measuring part, and
the mounting part is positioned at a second end of the second supporting shaft.

* * * * *